United States Patent
Weichmann (10) Patent No.: US 11,411,374 B2
(45) Date of Patent: Aug. 9, 2022

(54) VERTICAL CAVITY SURFACE EMITTING LASER (VCSEL) WITH IMPROVED GAIN-SWITCHING BEHAVIOR

(71) Applicant: TRUMPF Photonic Components GmbH, Ulm (DE)

(72) Inventor: Ulrich Weichmann, Ulm (DE)

(73) Assignee: TRUMPF PHOTONIC COMPONENTS GMBH, Ulm (DE)

(*) Notice: Subject to any disclaimer, the term of this patent is extended or adjusted under 35 U.S.C. 154(b) by 460 days.

(21) Appl. No.: 16/720,012

(22) Filed: Dec. 19, 2019

(65) Prior Publication Data
US 2020/0161833 A1 May 21, 2020

Related U.S. Application Data

(63) Continuation of application No. PCT/EP2018/065747, filed on Jun. 14, 2018.

(30) Foreign Application Priority Data

Jun. 22, 2017 (EP) .................................. 17177342

(51) Int. Cl.
*H01S 5/30* (2006.01)
*H01S 5/042* (2006.01)
*H01S 5/183* (2006.01)

(52) U.S. Cl.
CPC .......... *H01S 5/3095* (2013.01); *H01S 5/0421* (2013.01); *H01S 5/0427* (2013.01);
(Continued)

(58) Field of Classification Search
CPC .. H01S 5/18327; H01S 5/0421; H01S 5/0428; H01S 5/18313
(Continued)

(56) References Cited

U.S. PATENT DOCUMENTS

2001/0006503 A1 7/2001 Braitberg et al.
2002/0186726 A1 12/2002 Ledentsov et al.
(Continued)

FOREIGN PATENT DOCUMENTS

CN 1531769 A 9/2004
CN 1761112 A 4/2006
(Continued)

OTHER PUBLICATIONS

Lim, et al. "Self-Pulsating and Bistable VCSEL with Controllable Intracavity Quantum-Well Saturable Absorber," *Electronics Letters* 33, 20: 1708-1710 (Sep. 25, 1997). XP006007977.

*Primary Examiner* — Tuan N Nguyen
(74) *Attorney, Agent, or Firm* — Leydig, Voit & Mayer, Ltd.

(57) ABSTRACT

A Vertical Cavity Surface Emitting Laser (VCSEL) has a mesa having an active region, which has m active layer structures (with m≥2). The active layer structures are electrically connected to each other by a tunnel junction therebetween. The mesa has an optical resonator, which has first and second DBRs. The active region is between the first and second DBRs. The VCSEL has first and second electrical contacts, which provide electrical current to the active region, and an electrical control contact, which controls gain-switched laser emission of the VCSEL by at least 1 up to m−1 active layer structures by a current between the electrical control contact and the first or second electrical contact. A current aperture is between the active region and the first or second electrode. A distance between the current aperture and a furthest active layer structure is at least three times the laser light's wavelength.

14 Claims, 10 Drawing Sheets

(52) U.S. Cl.
CPC ........ *H01S 5/0428* (2013.01); *H01S 5/18313* (2013.01); *H01S 5/18327* (2013.01); *H01S 5/18347* (2013.01); *H01S 5/18397* (2013.01)

(58) Field of Classification Search
USPC ........................................................ 356/4.01
See application file for complete search history.

(56) References Cited

U.S. PATENT DOCUMENTS

| | | |
|---|---|---|
| 2003/0206741 A1 | 11/2003 | Ledentsov et al. |
| 2003/0231682 A1 | 12/2003 | Eitel |
| 2006/0078027 A1 | 4/2006 | Kim |
| 2012/0162662 A1 | 6/2012 | Flanders et al. |
| 2014/0169397 A1 | 6/2014 | Avrutin et al. |
| 2015/0063387 A1* | 3/2015 | Joseph ................. H01S 5/0234 372/36 |
| 2015/0180213 A1 | 6/2015 | Kurachi et al. |
| 2015/0219764 A1 | 8/2015 | Lipson |
| 2015/0311673 A1 | 10/2015 | Ghosh et al. |
| 2015/0380901 A1 | 12/2015 | Brenner et al. |
| 2017/0302059 A1 | 10/2017 | Gerlach et al. |
| 2018/0301865 A1* | 10/2018 | Burroughs ............ H01S 5/0262 |

FOREIGN PATENT DOCUMENTS

| | | |
|---|---|---|
| CN | 1816995 A | 8/2006 |
| CN | 103444020 A | 12/2013 |
| CN | 103562708 A | 2/2014 |
| CN | 104734007 A | 6/2015 |
| CN | 106797107 A | 5/2017 |
| EP | 1357648 A1 | 10/2003 |
| JP | 2003500787 A | 1/2003 |
| JP | 2006216862 A | 8/2006 |
| JP | 2006245473 A | 9/2006 |
| JP | 2011040557 A | 2/2011 |

* cited by examiner

VERTICAL CAVITY SURFACE EMITTING LASER (VCSEL) WITH IMPROVED GAIN-SWITCHING BEHAVIOR

CROSS-REFERENCE TO PRIOR APPLICATIONS

This application is a continuation of International Patent Application No. PCT/EP2018/065747, filed on Jun. 14, 2018, which claims priority to European Patent Application No. EP 17 177 342.7, filed on Jun. 22, 2017. The entire disclosure of both applications is hereby incorporated by reference herein.

FIELD

The invention relates to a Vertical Cavity Surface Emitting Laser (VCSEL) with improved gain-switching behavior and a time-of-flight sensor module comprising such a VCSEL. The invention further relates to a method of controlling gain-switching of the VCSEL. The invention further relates to a related computer readable medium product.

BACKGROUND

US 2014/0169397 A1 discloses a vertical cavity surface emitting laser (VCSEL) configured to operate in a gain switching regime including a cavity that is terminated by reflectors at both ends for enabling a standing wave of optical radiation therebetween. The cavity comprises at least one quantum well.

SUMMARY

Embodiments of the present invention provide a Vertical Cavity Surface Emitting Laser (VCSEL) with improved gain-switching behavior.

According to a first aspect, a VCSEL is provided. The VCSEL includes at least one mesa. The at least one mesa has an active region. The active region includes a number of m active layer structures with m≥2. The active layer structures are electrically connected to each other by means of a tunnel junction arranged between the active layer structures. The at least one mesa further includes an optical resonator. The optical resonator includes a first Distributed Bragg Reflector and a second Distributed Bragg Reflector. The active region is arranged between the first and the second Distributed Bragg Reflector. The VCSEL further includes a first electrical contact and a second electrical contact. The first and the second electrical contacts are arranged to provide an electrical current to the active region. The electrical current may be provided via the first and the second Distributed Bragg Reflector. Alternatively, one or more intracavity contact may be used to provide the electrical current directly to the active region. The VCSEL further includes an electrical control contact. The electrical control contact is arranged to control gain-switched laser emission of the VCSEL by means of at least 1 up to m−1 active layer structures by means of a current between the electrical control contact and the first electrical contact or the second electrical contact. The current applied through the electrical control contact may, for example, increase the inversion in the lower active layer structure up to the point where it is bleached—then lasing can occur. The gain-switching laser emission may, for example, be controlled by modulating a current across one of the active layer structures or, for example, by modulating optical carriers in common active layer structure if there is more than one mesa.

A mesa is a kind of "island" in a semiconductor layer structure on a semiconductor substrate, which is isolated from adjacent structures especially from other mesas by etching through a part of the semiconductor layer structure especially by etching through conducting layers of the semiconductor layer structure.

The described VCSEL can enable improved gain-switching behavior. Gain-switched VCSELs may be a good candidate for time-of-flight LIDAR applications such as 3D-sensors for mobile phones, industrial or automotive applications. Generation of ns-pulses is enabled by rapidly switching the diode gain via the drive current on and off. By using somewhat more advanced driver electronics, even gain-switching pulses with a duration in the ps-range are achievable. One main disadvantage of conventional VCSEL used for the described gain-switching scheme is—typical for semiconductor gain materials—the limited pulse power that can be reached.

VCSELs with a multistage bipolar cascade design as described above are arranged to enhance the gain-switching behavior of VCSELs and are especially arranged to reach higher pulse powers. Using two or more active regions separated by one or more tunnel-diodes (junctions), may lead to a bistable behavior, characterized by a delayed and sudden onset of laser emission and a hysteresis in the characteristic curve of laser-light versus driving-current taken in continuous-wave operation. In pulsed operation, this behavior may lead to an increase of the pulse power and to even shorter laser pulses in comparison to conventional VCSELs without the multistage bipolar cascade design. In an alternative approach, one or more mesas may be used with a multistage bipolar cascade design. One mesa may be used to generate laser light pulses, while via the other mesa or mesas, gain-switching of the first mesa can be controlled. In this way, short and strong gain-switching pulses with low jitter can be generated being beneficial for time-of-flight applications.

The electrical control contact may be arranged to control a starting time of the gain-switched laser emission by means of the current between the electrical control contact and the first electrical contact or the second electrical contact. The current amplitude or the slope of the current pulse provided by means of the control contact may be used to electrically pump the active layer structures independently. Independent pumping of the different active layer structures enables improved control about the moment in time in which lasing of the VCSEL starts.

The VCSEL may include a current aperture arranged between the active region and the first or the second electrode. A distance between the current aperture and an active layer structure furthest away from the current aperture may be at least three times the wavelength of laser light emitted by the VCSEL in the semiconductor material. The large distance between the current aperture and the active layer structure furthest away from the current aperture supports a strong bistable behavior in continuous wave (cw) operation by increasing inhomogeneous pumping of the active layer structures. Inhomogeneous pumping is increased by decreasing the current density in the active layer structure furthest away from the current aperture by increasing the distance between the current aperture and the active layer structure furthest away from the current aperture. The material wavelength is the optical wavelength of the laser light in the material of the VCSEL.

A photoluminescence wavelength of the VCSEL may be at least the resonance wavelength of the optical resonator. Photoluminescence wavelength refers to the peak of the photoluminescence emission spectrum. This spectrum is measured by exciting a material (in this case the semiconductor material of the active layer structure or structures of the VCSEL) with an intense light source and recording the spectrum of the emitted light. A short photoluminescence wavelength of the bottom active layer structure means a high transparency current density for the bottom active layer structure. In that way, the upper active layer structure is pumped far above transparency while the bottom active layer structure is still absorbing and therefore prevents laser action in the cavity. In that way, the inversion in the upper active layer structure is increased and accordingly the intensity of the gain-switched pulse that is released once the bottom active layer structure reaches transparency. The photoluminescence wavelength of the VCSEL in relation to the resonance wavelength of the optical resonator enables a further possibility to control the laser emission of the VCSEL because the photon density and therefore the peak intensity is increased. The photoluminescence wavelength of the active layer structures can be tuned by means of the material composition of the active layer structure.

The photoluminescence wavelength of the active layer structure furthest away from the current aperture may be shorter than a photoluminescence wavelength of any other active layer structure included by the active region in order to enhance the effect described above.

The electrical control contact may be arranged such that a first electrical current can be provided between the first electrical contact and the electrical control contact, and a second electrical current can be provided between the second electrical contact and the electrical control contact. The first electrical current is independent from the second electrical current. The active layer structures may be stacked upon each other and tunnel junctions (tunnel diodes) are arranged between the active layer structures. The control contact may be arranged between the first and the second electrode such that the first electrical current can be provided to the active layer structures arranged between the first electrical contact and the electrical control contact. In addition, the second electrical current can be provided to the active layer structures arranged between the electrical control contact and the second electrical contact. Alternatively, a third electrical current may be provided to the active region by means of the first electrical contact and the second electrical contact in combination with the first electrical current or the second electrical current. Using essentially independent first and second electrical currents or current pulses, first and third electrical currents or current pulses, or second and third electrical currents, or current pulses in combination with a corresponding timing of the pulses with respect to each other enable a defined control of the laser emission properties of the VCSEL. Especially emission time and duration of the laser light (laser pulse) emitted by the VCSEL may be controlled in a very precise way by controlling current amplitude and slope of the current amplitude of the first, the second or the third electrical current.

The electrical control contact arranged between the first electrical contact and the second electrical contact may, for example, be arranged to provide a constant current to at least 1 up to m−1 active layer structures, where the constant current is below a laser threshold of the at least 1 up to m−1 active layer structures. The constant current may, for example, be characterized by a rectangular current pulse provided for a defined time period. A current just below the laser threshold makes the 1 up to m−1 active layer structures very sensitive to any change of light emission of the remaining active layer structures. It is therefore possible to control laser emission in a very sensitive way by means of small changes of a current provided to the remaining active layer structures. The start time of the laser emission may therefore be controlled in a precise way. Furthermore, the constant current (current pulse) enables a sensitive control of the end time of the laser emission by switching off the current path and therefore increasing absorption in the 1 to m−1 active layer structures.

The VCSEL may include at least two mesas. At least a first mesa is arranged to provide the gain-switched laser emission. At least a second mesa is arranged to control gain-switched laser emission of the at least first mesa. Two, three, four or more mesas may be used to control gain-switched laser emission of the VCSEL by means of the current between the electrical control contact and the second electrical contact.

The at least two mesas may include at least 1 up to m−1 common active layer structures. The common active layer structures are arranged below the etch stop of the mesas and build a common base of the mesas. Semiconductor layers of the mesas arranged above the etch stop are separated from each other. The at least second mesa is arranged to control the gain switched laser emission of the at least first mesa by means of transversal (most likely optical) pumping via the at least 1 up to m−1 common active layer structures.

The electrical control contact may be arranged to control transversal (optical) pumping via the at least 1 up to m−1 common active layer structures by means of the current between the electrical control contact and the second electrical contact. The common active layer structures may, for example, independently and especially locally be electrically pumped by a second electrical current between the electrical control contact and the second electrical contact. The second electrical contact is in this case a common electrical contact for all mesas. The second electrical current causes light emission in the regions of the common active layer structures which are electrically pumped by the second electrical current. The spontaneous or stimulated light emission is guided along the common active layer structures and causes most likely optical pumping in the regions of the common active layer structures which are electrically pumped by the first current. Intensity of the transversal optical pumping can be controlled by means of the second electrical current.

The at least second mesa is arranged such that laser emission in the same direction as the at least one mesa is inhibited. Inhibiting laser emission of the second, third, fourth or more mesas used for transversal optical pumping of the first mesa may be performed by providing an electrical control contact across the surface of the respective mesa. Alternatively or in addition, the (first) DBR which is arranged adjacent to the electrical control contact (electrical control contact may be deposited on top of the first DBR) may be arranged such that laser emission is inhibited or avoided.

The first electrical contact and the second electrical contact are arranged to control a stop time of the gain-switched laser emission by means of a current between the first electrical contact and the second electrical contact. The current between the first electrical contact and the second electrical contact may, for example, decrease such that transversal (optical) pumping by means of the two, three, four or more mesas—especially not lasing mesas around—is not sufficient to enable gain-switched laser emission of the first mesa. The gain in the first active region drops below threshold by lowering the current between first and second electrical contact.

A time-of-flight sensor module may include at least one VCSEL according to any embodiment as discussed above. The time-of-flight sensor module further includes an electrical driver arranged to provide the current between the first electrical contact and the second electrical contact as well as between the electrical control contact and the first electrical contact or the second electrical contact. The VCSEL may enable gain-switched laser emission with superior timing and shortened emission time (pulse length of the laser pulse). Accuracy of the time-of-flight sensor module may therefore be increased.

According to a second aspect, a method of controlling gain-switching of a Vertical Cavity Surface Emitting Laser including m active layer structures with m≥2 in a stacked arrangement is provided. The method includes the step of:

providing a first electrical current to at least 1 up to m−1 active layer structures involved in laser emission, and providing a second electrical current to the remaining active layer structures involved in laser emission, where the first electrical current is independent from the second electrical current.

The method may include further steps of controlling the currents in order to enable higher power gain switched pulses and improved control of timing and duration of such gain switched pulses as described in the embodiments above.

The method of controlling gain-switching of a Vertical Cavity Surface Emitting Laser including m active layer structures with m≥2 in a stacked arrangement may be characterized in that the stacked arrangement includes an optical resonator. The active layer structures are electrically connected to each other by means of a tunnel junction arranged between the active layer structures. The optical resonator includes a first Distributed Bragg Reflector and a second Distributed Bragg Reflector. The active region is arranged between the first and the second Distributed Bragg Reflector. The Vertical Cavity Surface Emitting Laser further includes a first electrical contact, a second electrical contact and an electrical control contact. The Vertical Cavity Surface Emitting Laser includes a current aperture arranged between the active region and the first or the second electrode. A distance between the current aperture and an active layer structure furthest away from the current aperture is at least three times the wavelength of laser light emitted by the Vertical Cavity Surface Emitting Laser in the semiconductor material such that a current density in the active layer structure furthest away from the current aperture is decreased in comparison to the active layer structure next to the current aperture. The method includes the steps of:

providing a first electrical current to at least 1 up to m−1 active layer structures involved in laser emission by means of the electrical control contact and the first electrical contact or the second electrical contact, and providing a second electrical current to the active region by means of the first and the second electrical contact to the remaining active layer structures involved in laser emission. The first electrical current is independent from the second electrical current.

According to a further aspect a computer program product is provided. The computer program product includes code means, which can be saved on at least one memory device included by the time-of-flight sensor module as described above or on at least one memory device of a device including the time-of-flight sensor module. The code means are arranged such that the method according to any embodiment described above and below can be executed by means of at least one processing device included by the time-of-flight sensor module or by means of at least one processing device of the device including the time-of-flight sensor module.

The memory device or the processing device may be included by the time-of-flight sensor module (e.g. electrical driver, controller etc.) or the device including the time-of-flight sensor module. A first memory device and/or first processing device of the device including the time-of-flight sensor module may interact with a second memory device and/or second processing device included by the time-of-flight sensor module.

The memory device or devices may be any physical device being arranged to store information especially digital information. The memory device may be especially selected out of the group solid-state memory or optical memory.

The processing device or devices may be any physical device being arranged to perform data processing especially processing of digital data. The processing device may be especially selected out of the group processor, microprocessor or application-specific integrated circuit (ASIC).

Further advantageous embodiments are defined below.

These and other aspects of the invention will be apparent from and elucidated with reference to the embodiments described hereinafter.

BRIEF DESCRIPTION OF THE DRAWINGS:

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

In the Figures, like numbers refer to like objects throughout. Objects in the Figures are not necessarily drawn to scale.

DETAILED DESCRIPTION

Various exemplary embodiments of the present invention will now be described with reference to the Figures.

Figure 1:
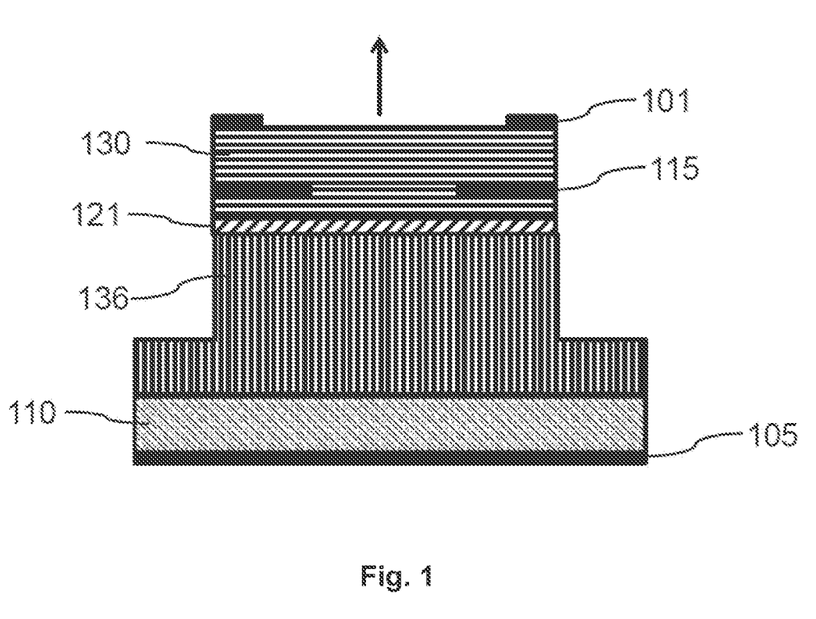
FIG. 1 shows a principal sketch of a VCSEL.

FIG. 1 shows a VCSEL 100. The VCSEL includes a semiconductor substrate 110 (GaAs). A second DBR (n-DBR) 136 is deposited on a first surface of the substrate 110. A second electrical contact 105 (n-contact) is deposited on the second surface of the substrate 110 which is opposite to the first surface. The second DBR includes a number of layers with alternating refractive indices and is characterized by a reflectivity of usually more than 99.99%. A first active layer structure 121 including a number of sublayers forming a quantum well is deposited on top of the second DBR 136. The first active layer structure 121 is arranged to emit light if a current above a laser threshold traverses the first active layer structure 121. The first DBR (p-DBR) 130 is deposited on top of the first active layer structure 121. The first DBR 130 includes like the second DBR 136 a number of layers with alternating refractive indices and is characterized by a lower reflectivity of, for example 99% such that laser emission through the first DBR 130 is enabled based on light generated in the first active layer structure 121. The first DBR 130 further includes a current aperture 115, which is oxidized in one of the layers of the first DBR 130. This current aperture 115 (or oxide aperture) is arranged near to the first active layer structure 121 in order to confine an electrical current to a defined region of the first active layer structure 121. A (in this case a ring shaped) first electrical contact 101 (p-contact) is provided on top of the first DBR 130 such that an electrical current can be provided by means of the first and the second electrical contact 101, 105 to the active layer structure 121 via the first DBR 130 and the second DBR 136 confined by the current aperture 115. The laser light is emitted from the area surrounded by the ring shaped first electrical contact 101. The VCSEL may include additional supporting layers which are not shown in FIG. 1 but well known to those skilled in the art. The VCSEL includes an etched mesa extending above the substrate 110 and a part of the second DBR 136.

Figure 2:
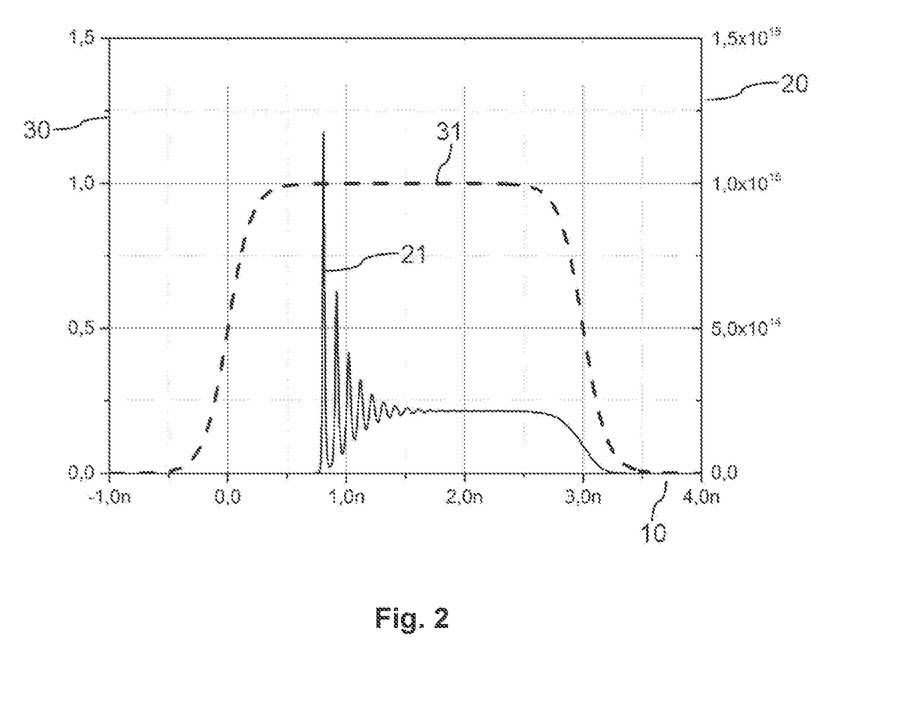
FIG. 2 shows current pulse shape and photon density of a VCSEL.
Figure 3:
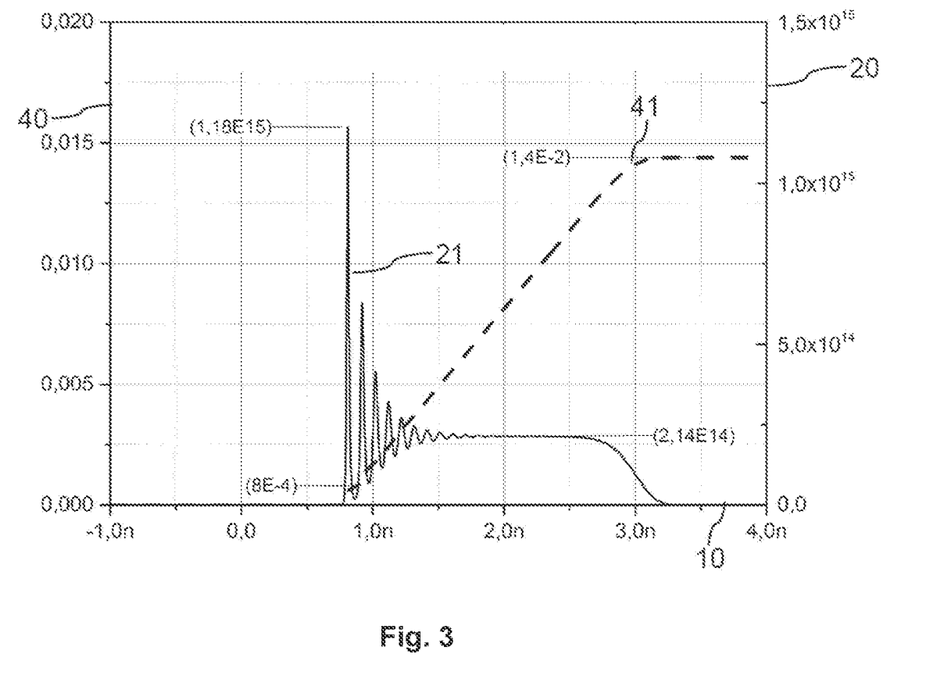
FIG. 3 shows photon density and power conversion efficiency of the VCSEL.

FIG. 2 shows current pulse shape 31 and photon density 21 of a VCSEL with 10 µm active diameter and 8 nm-wide $In_{0.2}Ga_{0.8}As$ quantum wells. Gain switching can be modelled by solving the rate equations for charge carriers and photons. FIG. 2 shows the time 10 in nanoseconds at the bottom, the electrical current 30 in arbitrary unit at the left side and the simulated photon density 20 (photons/cm$^3$) at the right side. In a first simulation, a square current pulse 31 with a maximum current of 1.4 mA, corresponding to about twice the threshold current, and pulse duration of 3 ns was applied. The square current pulse 31 results in a photon density 21 showing a narrow peak with the peak photon density of around $1.18 \times 10^{15}$ around 0.4 ns (gain-switched pulse) after the current pulse 31 reaches its maximum current. The narrow peak is followed by a damped oscillation and reaches around 0.7 ns after the narrow peak a stable photon density of around $2.14 \times 10^{14} cm^{-3}$. To calculate the efficiency, the photon density 21 was converted to optical power and the integral of the optical power was divided by the total electrical power in the current pulse 31. For simplicity, a laser voltage of 2 V was assumed. The result is presented in FIG. 3 showing photon density 21 and power conversion efficiency 41 of the VCSEL. FIG. 3 shows the time 10 in nanoseconds at the bottom, the power conversion efficiency 40 in percent at the left side and the simulated photon density 20 (photons/cm$^3$) at the right side. The gain-switched pulse is roughly one order of magnitude (more precisely, a factor of 5.5) higher than the main pulse characterized by the essentially stable or constant photon density 21. At the same time, the efficiency of the gain-switched pulse is roughly one order of magnitude lower (more precisely, a factor of 17.5) than the main pulse. In principle, the current pulse 31 shown in FIG. 2 could be shortened to about 1 ns for the gain-switched operation, which would improve the ratio of the efficiencies accordingly.

Figure 4:
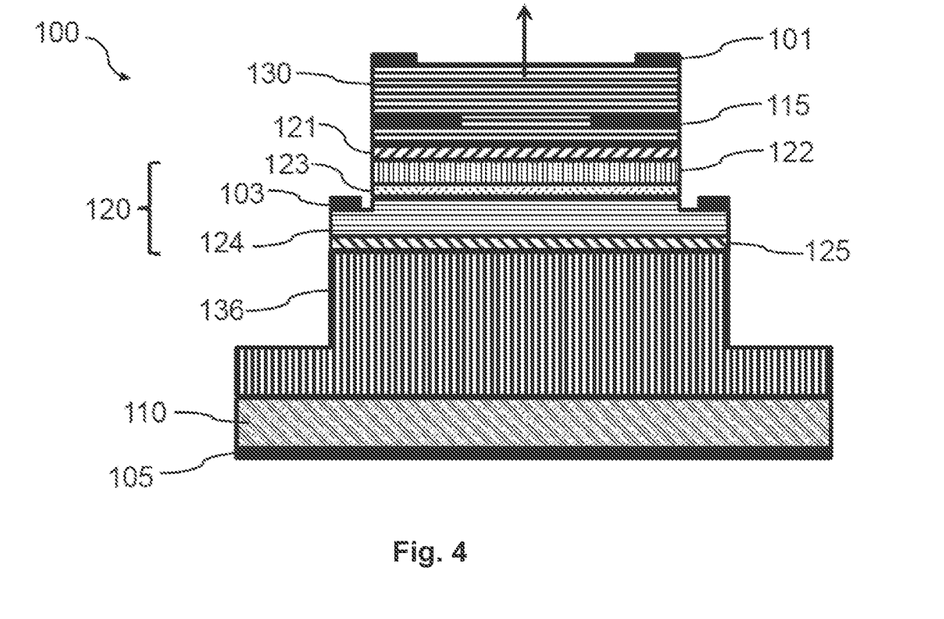
FIG. 4 shows a first embodiment of a VCSEL.

FIG. 4 shows a first embodiment of a VCSEL 100 enabling improved gain-switching. The basic configuration is similar to the VCSEL discussed with respect to FIG. 1. The first electrical contact 101, the first DBR 130 (p-doped DBR in case of an n-doped semiconductor substrate) with embedded current aperture 115, the second DBR 136 (n-doped DBR in case of an n-doped semiconductor substrate), the substrate 110 and the second electrical contact 105 are arranged in the same sequence as discussed with respect to FIG. 1. In this first embodiment an active region 120 is embedded between the first DBR 130 and the second DBR 136. The active region 120 includes a second active layer structure 125 including a number of sublayers as discussed above, which is stacked on top of the second DBR 136. A second junction layer 124 is stacked on top of second active layer structure 125. The second junction layer 124 includes in this case a p-type semiconductor material. A tunnel junction 123 is deposited on top of the second junction layer 124 and includes a highly doped p$^{++}$-layer, which is in contact with the junction layer 124 on a first side and which is in contact with a highly doped n$^{++}$-layer on a second side forming the tunnel junction 123. On top of the highly doped n$^{++}$-layer is a first junction layer 122 deposited, which includes n-type semiconductor material. The active region 120 is finalized by the first active layer structure 121, which is deposited on the first junction layer 122. In tunnel junction 123, charge carriers tunnel from valence to conduction band and are effectively recycled so that the first (upper) active layer structure 121 is also pumped with electrons from one and holes from the other side, just like the second (lower) active layer structure 125. An electrical control contact 103 is in this embodiment provided between the second active layer structure 125 and the tunnel junction 123 such that independent control of the currents through the first and the second active layer structure 121, 125 is enabled. In the embodiment shown in FIG. 4 the mesa is tapered such that there is a kind of step in the second junction layer 124. The electrical control contact 103 (second p-contact) is provided on top of this step. The step can be provided by means of a corresponding etching process down to the second junction layer 124. The highly-doped p+++-layer of the tunnel junction 123 is used to apply a current via the electrical control contact 103 and allows to modulate the current in the second (lower) active layer structure 125 while keeping the current through the first (upper) active layer structure 121 just below the onset of lasing ($I_{on}$). In that way, the absorption within the cavity is modulated and lasing is switched on and off accordingly as discussed in more detail below.

The embodiment discussed with respect to FIG. 4 is one example of a tunnel junction VCSEL 100, other designs may include more tunnel junctions and active layer structures 121, 125 or improve the current confinement by the use of several current apertures 115. Depending on the specific design, an increase in slope efficiency is observed, which is almost linear with the number of active layer structures 121, 125. In that way, quantum efficiencies exceeding 100% can be demonstrated. The laser threshold current is reduced with increasing numbers of active layer structures 121, 125. At the same time, the laser voltage increases due to the additional active layer structures 121, 125 and the additional voltage drop across the tunnel junction(s) 123.

Figure 5:
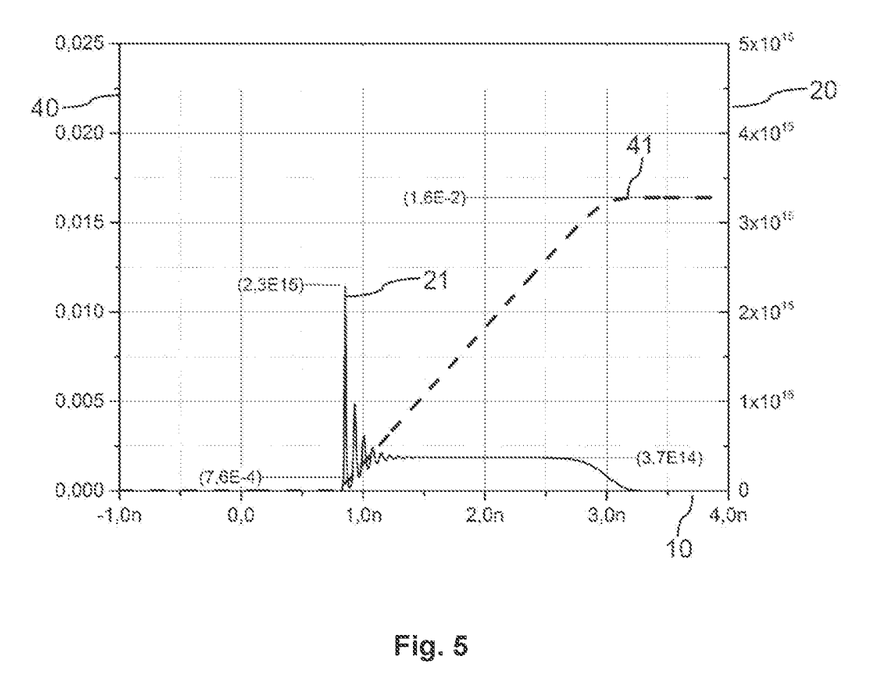
FIG. 5 shows photon density and power conversion efficiency of the first embodiment.

FIG. 5 shows photon density 21 and power conversion efficiency 41 of the first embodiment of a VCSEL 100 enabling improved gain-switching. The calculations described above with respect to FIGS. 2 and 3 can be extended to the case of more than one active layer structure 121, 125 by adding equations for the carrier densities in the additional active layer structures 125 and adding a leakage current that reduces the current in the additional active layer structures 125. In this way, pulses from VCSELs 100 with bipolar cascade design (including at least two active layer structures 121, 125 electrically connected by means of a tunnel junction 123) can be calculated. FIG. 5 shows again the time 10 in nanoseconds at the bottom, the power conversion efficiency 40 in percent at the left side and the simulated photon density 20 (photons/cm$^3$) at the right side. A 10 µm-VCSEL 100 with two active layer structures 121, 125 separated by a tunnel junction 123 is simulated. The driving current is a pulse of 1.4 mA height and 3 ns-duration. In addition, a leakage current of 0.35 mA is assumed, that reduces the carrier density in the second (lower) active layer structure 125 to 75% of the current in the first (upper) active layer structure 121. It is remarkable, that the height of the gain-switching pulse (narrow peak) increases by about a factor of 2 as compared to the case of the VCSEL with only one active region.

Figure 6:
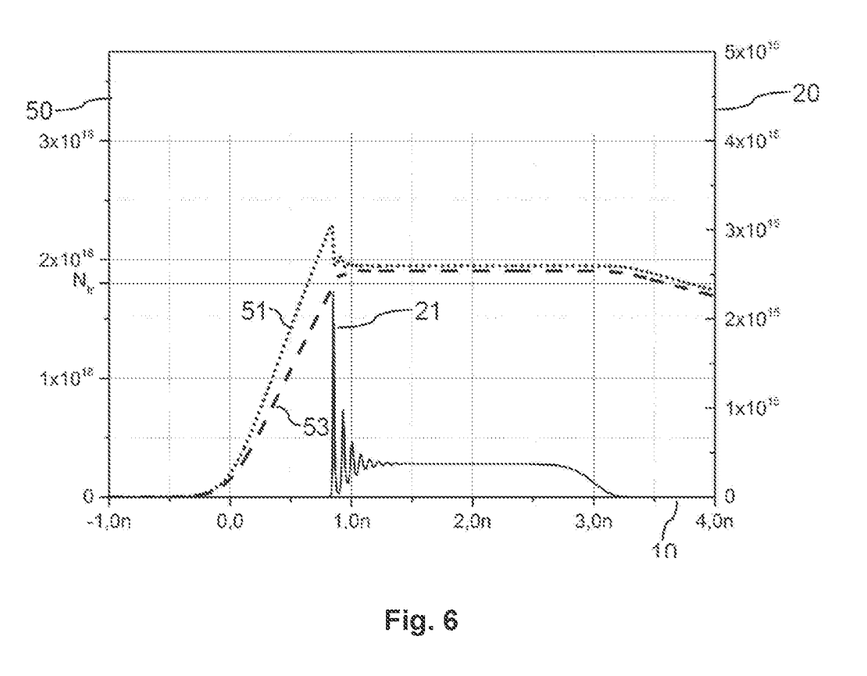
FIG. 6 shows carrier densities and photon density of the first embodiment.

It is instructive to have a look at the carrier densities 51, 53 in the first and second active layer structure. This is shown in together with the photon density 21 in FIG. 6 showing again the time 10 in nanoseconds at the bottom, the carrier density [cm$^{-3}$] 50 at the left side and the simulated photon density 20 (photons/cm$^3$) at the right side. Due to the leakage current, the lower carrier density 53 in the second (lower) active layer structure 125 rises slower than the upper carrier density 51 in the first (upper) active layer structure 121. As long as the lower carrier density 53 stays below the transparency carrier density $N_{tr}$ as indicated on the left side, the second (lower) active layer structure 125 provides an additional loss to the optical resonator (laser cavity) which is built by the first and the second DBR 130, 136 and the layers in between. This additional loss prevents lasing and allows the upper carrier density 51 in the first (upper) active layer structure 121 to increase further above the threshold carrier density, than in the case of only one active layer structure 121. As soon as the second active layer structure 125 reaches transparency, the additional loss is removed and a strong gain-switching peak is released (narrow peak of the photon density 21 at the moment in time at which the lower carrier density reaches $N_{tr}$). Compared to the VCSEL 100 with only one active layer structure 121, the higher upper carrier density 51 in the first active layer structure allows for the emission of a more intense gain-switching pulse. Pumping the second active layer structure 125 separately by means of the electrical control contact 103, as sketched in the first embodiment of FIG. 4, allows to control the current through the second active layer structure 125 and therefore precisely release the gain-switching pulse.

Figure 7:
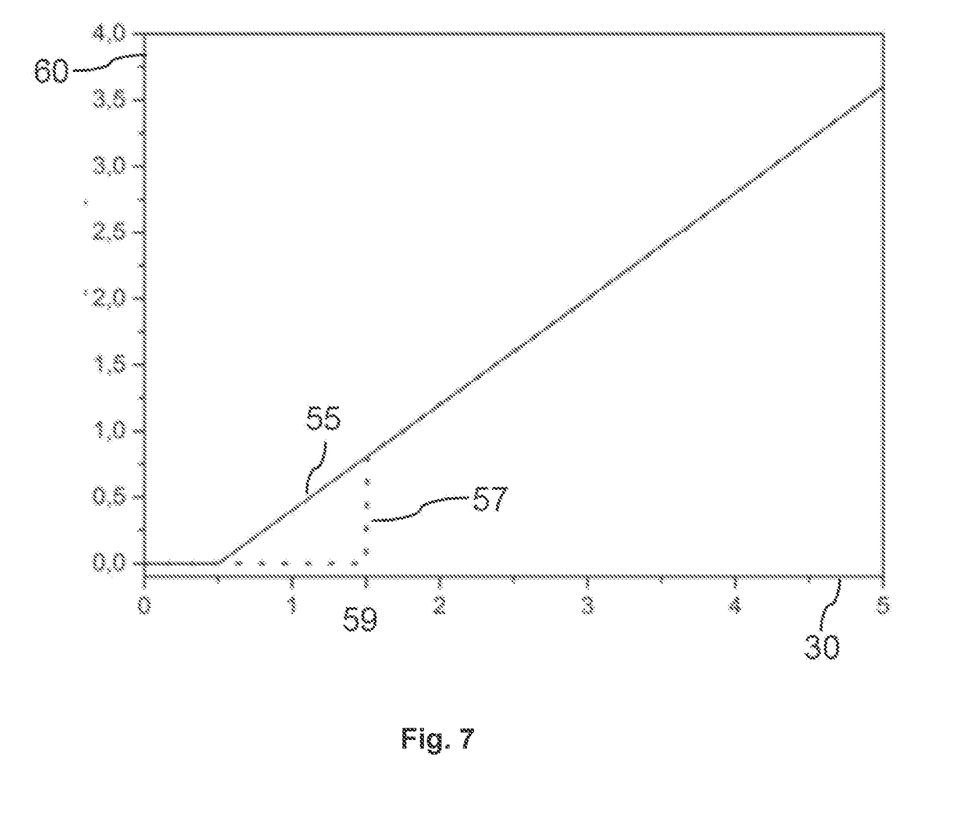
FIG. 7 shows bistable behavior of the first embodiment.

One design consideration is the separation of the active layer structures 121, 125 with respect to the electric field in the VCSEL 100. Ideally, the active layer structures 121, 125 are placed in the maximum of the standing wave pattern to ensure maximum gain. The tunnel junction 123 as well as current aperture or apertures 115 on the other hand should be placed in the minimum of the standing wave pattern to reduce the optical losses. The effect of the difference can be demonstrated with respect to a design with two active layer structures 121, 125 placed at a distance 2.5 times the material wavelength away from each other and a tunnel junction 123 in between. One design (A) includes two current apertures 115, one above the first (upper) active layer structure 121 and one between the active layer structures 121, 125. The other design (B) uses only one current aperture 115, like in the sketch in FIG. 4. While design A shows normal characteristic curves with a clear laser threshold, design B exhibits bistable behavior, which is characterized by a sudden onset of the laser emission at elevated laser currents. The effect is especially pronounced for VCSELs 100 with short emission wavelength. FIG. 7 shows an example of bistable behavior of the modification the first embodiment shown in FIG. 4 in accordance with design B. The current 30 (arbitrary units) is plotted on the x-axis where the optical power 60 is plotted on the y-axis. Bistable behavior is explained by inhomogeneous pumping of the two active layer structures 121, 125. The current density will be highest within the current aperture and drop the further the active layer structures 121, 125 are away from the current aperture 115. Therefore, for a given laser current, the first (upper) active layer structure 121 will be pumped with a higher current density, than the one further away from the current aperture 115. For certain current ranges, the first (upper) active layer structure 121 is pumped above transparency and provides gain, while the second (lower) active layer structure 125 generates a high loss in the cavity as discussed with respect to FIG. 6. At a certain onset current 59 ($I_{on}$) the second (lower) active layer structure 125 is pumped to or above transparency, while the first (upper) active layer structure 121 is pumped well above threshold gain. In that case, laser action takes place above threshold due to the highly pumped first (upper) active layer structure 121. The current density 50 at different active layer structures 121, 125 can be controlled to a certain extent by means of the design and positioning of, for example, the current apertures 115. An independent and therefore improved control is provided by means of the electrical control contact 103 which enables to provide independent currents and therefore current densities to the respective active layer structure 121, 125.

Figure 8:
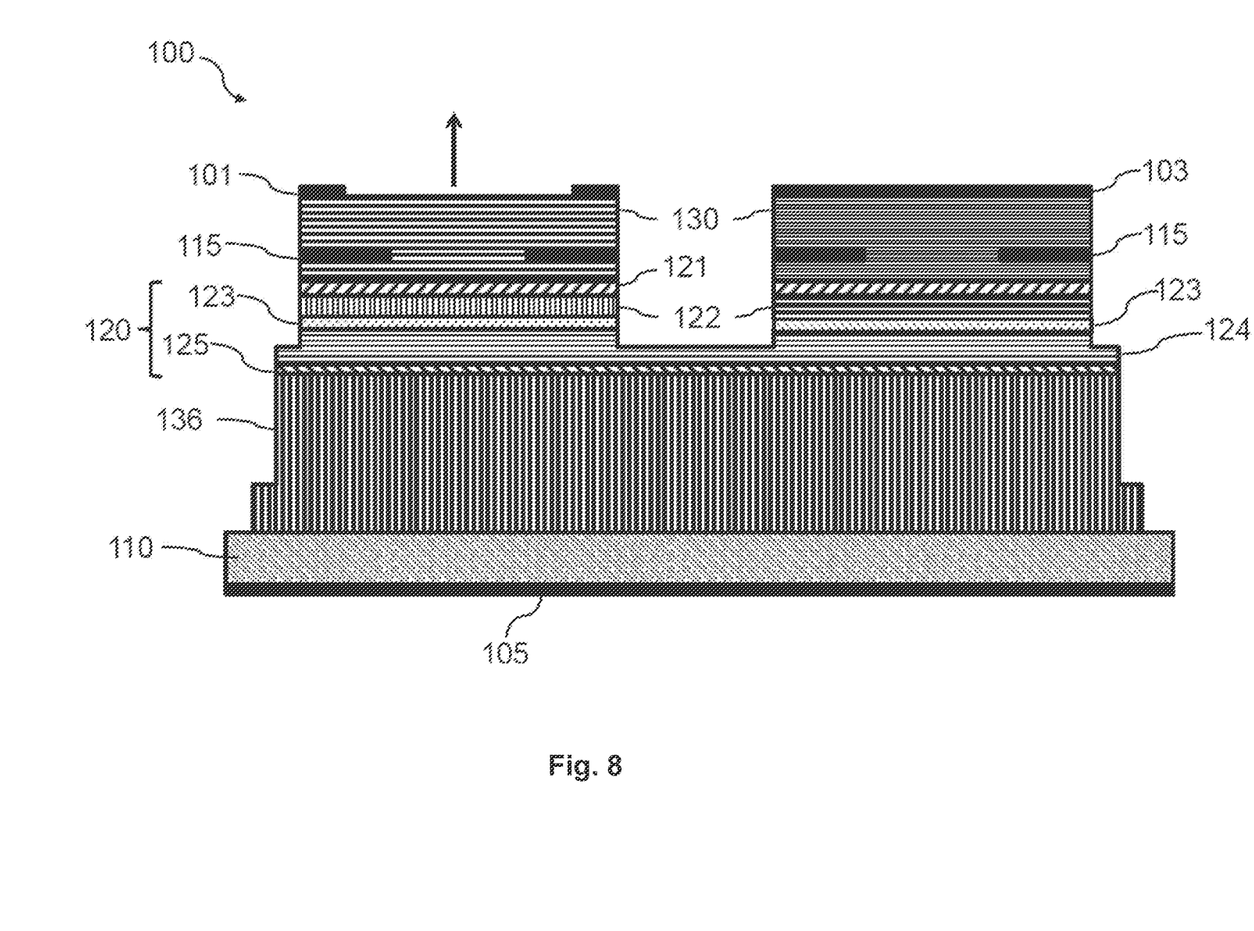
FIG. 8 shows a second embodiment of a VCSEL.

FIG. 8 shows a second embodiment of a VCSEL 100 with improved gain switching. In this second embodiment two mesas are used. A first mesa shown on the left side is nearly identical with the single mesa of the VCSEL 100 according to the first embodiment shown in FIG. 4. The main difference is that there is no electrical control contact 103, which is arranged between the first electrical contact 101 and the second electrical contact 105 such that there is no possibility to provide independent currents to the first and the second active layer structures 121, 123. The second mesa on the right side is characterized by essentially the same semiconductor layer structure but instead of a first electrical contact 101, which allows lasing through an aperture an electrical control contact 103 is provided on top of the mesa covering the whole upper surface of the first DBR 130. The mesa on the left side therefore allows lasing by providing an electrical current by means of the first and the second electrical contact 101, 105. The electrical control contact 103 covering the upper surface of the mesa on the right side inhibits lasing of the mesa at the right. The first and the second mesa share the same layer stack up to a defined height between the second optical layer structure 125 and the tunnel junction 123.

Figure 9:
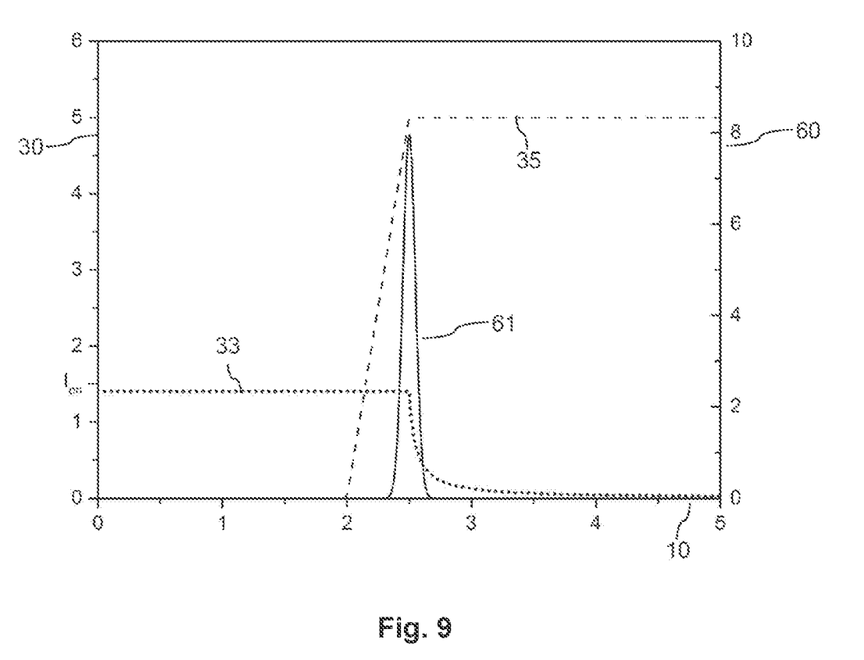
FIG. 9 shows a sketch of currents through open and closed mesas in the second embodiment.

The operating principle of the second embodiment of the VCSEL 100 is discussed with respect to FIG. 9 showing a sketch of currents 33, 35 through open and closed mesas. The time 10 in nanoseconds is shown again at the bottom, the electrical current 30 in arbitrary units at the left side and the simulated optical power 60 in arbitrary units at the right side. A constant current 33 below the threshold current ($I_{on}$) is provided to the open mesa for around 2.5 ns. In this situation the second (lower) active layer structure 125 in the open mesa provides just enough absorption to prevent lasing. The current 35 through the closed mesa is then used to control the laser emission from the open mesa. A rising current 35 with a constant slope is provided to the closed mesa after 2 ns where the slope is arranged such that the current 35 reaches its maximum (more than three times the threshold current) around 0.5 ns after ramping up. Ramping up the current 35 through the closed mesa rapidly, laser action inside the cavity will take place and most likely by transversal optical pumping (see explanation provided with respect to FIG. 10) the lower active region in the open cavity will be brought to or even above transparency. A strong laser pulse will be emitted from the open mesa. The pulse duration of this strong pulse from the open mesa is kept short, when the drive currents 33, 35 through both mesas are synchronized in a way that is sketched in FIG. 9. Switching off the current 33 through the open mesa, when the laser action in the closed mesa is sufficient to pump the lower active region above transparency, will ensure the emission of a single very short pulse. This embodiment is of course not limited to one open and one closed mesa, other combinations, like one central open mesa surrounded by several closed mesas are also possible. The lasing and non lasing mesas may share two, three, four or more common active layer structures 125 and corresponding tunnel junctions 123. The part of the mesas, which are separated from each other may include two, three, four or more active layer structures 121. Two, three, four or more current apertures 115 may be used to provide a defined current density to the respective active layer structures 121 at a given electrical current.

Figure 10:
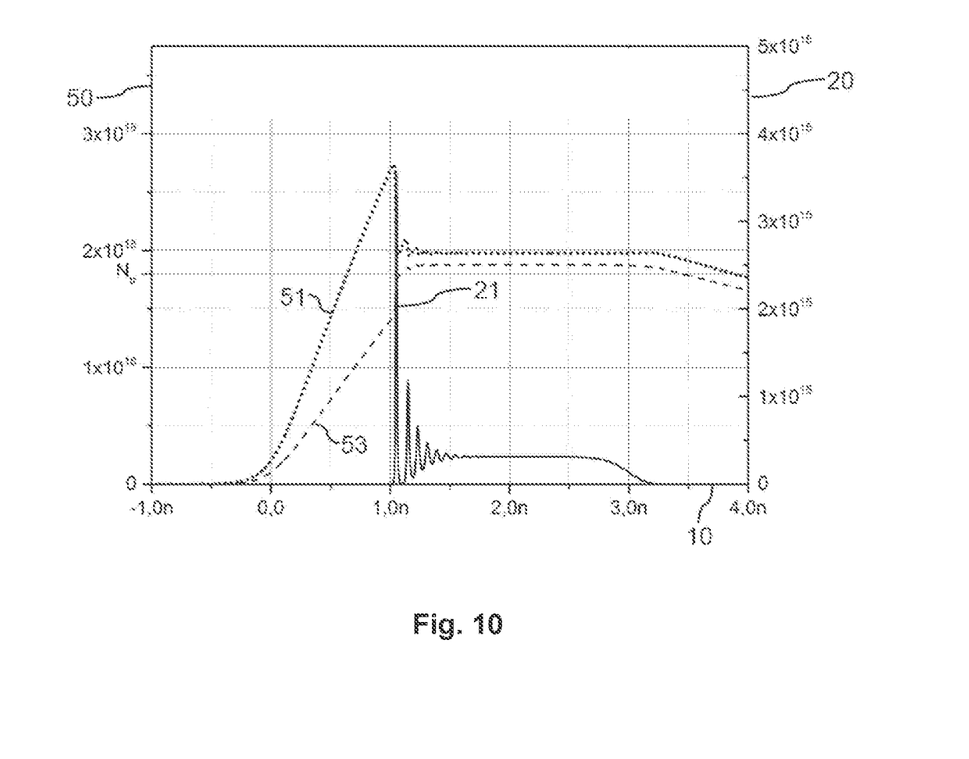
FIG. 10 shows an example of carrier densities and photon density of the second embodiment.

FIG. 10 shows an example of carrier densities 51, 53 and photon density 21 of the second embodiment shown in FIG. 8. FIG. 10 shows again the time 10 in nanoseconds at the bottom, the carrier density 50 [$cm^{-3}$] at the left side and the simulated photon density 20 (photons/$cm^3$) at the right side. The carrier density 53 in the second (lower) active layer structure 125 rises slowly so that the first active region is pumped quite far above threshold. In addition, the carrier density in the second (lower) active layer structure 125 is increased above the transparency current density by most likely optical instead of electrical pumping. This can be derived from the jump in the carrier density 53 of the second (lower) active layer structure 125, when the pulse is released. At this time, the first (upper) active layer structure 121 has accumulated enough gain to overcome the loss of the second (lower) active layer structure 125 and lasing occurs. The high photon density 21 in turn, bleaches the second (lower) active layer structure 125. In a similar way, photons from the second closed mesa can be used to bleach the second (lower) active layer structure 125 of the first mesa. The peak intensity of the pulse (narrow peak in photon density 21) released here is about 3 times higher than for the VCSEL with single active region (see FIGS. 2 and 3).

Figure 11:
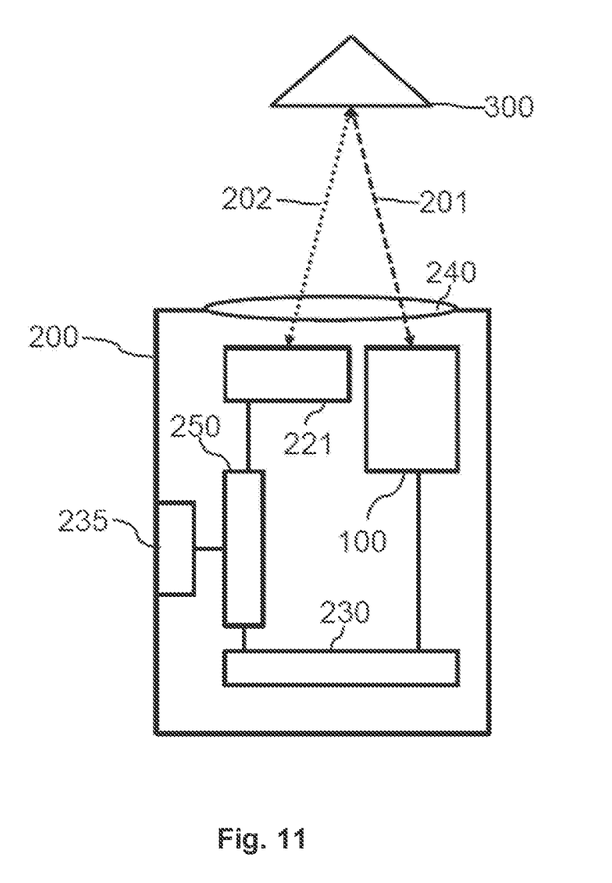
FIG. 11 shows a principal sketch of a time-of-flight sensor module.

FIG. 11 shows a principal sketch of a time-of-flight sensor module 200. The time-of-flight sensor module 200 includes a VCSEL 100, for example, in accordance with the second embodiment discussed above. The time-of-flight sensor module 200 further includes a detector 221 which is arranged to detect very short light pulses. Such short laser pulses may be caused by laser light 201 emitted by the VCSEL 100 hitting an object 300. A part of the emitted laser light 201 is reflected by the object 300 such that reflected laser light 202 is received by detector 221. The reflected laser light 202 causes a corresponding electrical signal in the detector 221. An electrical driver 230 is arranged to electrically drive the VCSEL 100 in accordance with, for example, the driving scheme discussed with respect to FIG. 9. A controller 250 is connected with the electrical driver 230 in order to control, for example, start and stop time of the laser pulse emitted by VCSEL 100. The controller 250 is further connected with the detector 221 in order to receive the electrical signal caused by the reflected laser light 202 detected by detector 221. The time-of-flight sensor module 200 further includes an optional interface 235 to transfer start and stop time of the emitted laser light 201 as well as time of reception of the electrical signal caused by the reflected laser light 202. The transferred data can be used to calculate the time-of-flight of the laser light and therefore a distance between the time-of-flight sensor module 200 and the object 300. The time-of-flight sensor module 200 may alternatively include an evaluator (not shown) electrically connected with the controller 250 (or may include controller 250) in order to determine the distance to the object. Several distance measurements may be used to determine a velocity or even an acceleration of the object 300.

Figure 12:
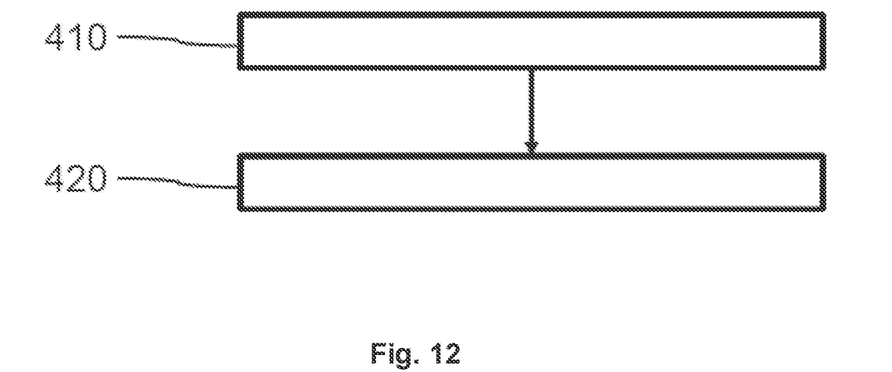
FIG. 12 shows a principal sketch of a method of controlling gain-switching of a VCSEL according to the first or second embodiment.

FIG. 12 shows a principal sketch of a method of controlling gain-switching of a VCSEL according to the first or second embodiment. A first electrical current is provided to at least 1 up to m−1 active layer structures 125 involved in laser emission in step 410. A second electrical current is provided to the remaining active layer structures 121 of the active layer structures 121, 125 involved in laser emission in step 420. The first electrical current is independent from the second electrical current. Active layer structures 121, 125 involved the laser emission are such active layer structures 121, 125 which interact with the optical wave in the optical resonator emitting laser light.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

Additionally, statements made herein characterizing the invention refer to an embodiment of the invention and not necessarily all embodiments.

The terms used in the claims should be construed to have the broadest reasonable interpretation consistent with the foregoing description. For example, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 10 time [ns]
20 photon density [cm$^{-3}$]
21 simulated photon density
30 current [arbitrary unit]
31 applied current pulse
33 current applied to open mesa
35 current applied to close to the mesa
40 power conversion efficiency [%]
41 simulated power conversion efficiency
50 carrier density [cm$^{-3}$]
51 upper carrier density
53 lower carrier density
55 normal behavior
57 bistable behavior
59 onset current I$_{on}$
60 optical power [arbitrary unit]
61 simulated optical power
100 Vertical Cavity Surface Emitting Laser (VCSEL)
101 first electrical contact
102 light emission inhibiting layer
103 electrical control contact
105 second electrical contact
110 substrate
115 current aperture
121 first active layer structure
122 first junction layer
123 tunnel junction
124 second junction layer
125 second active layer structure
130 first DBR
136 second DBR
200 time-of-flight sensor module
201 emitted laser light
202 reflected laser light
221 detector
230 electrical driver
235 interface
240 optical device
250 controller
300 object
410 step of providing a first electrical current
420 step of providing a second electrical current

The invention claimed is:

1. A Vertical Cavity Surface Emitting Laser comprising at least one mesa,
   wherein the at least one mesa comprises an active region,
   wherein the active region comprises a number of m active layer structures with m≥2,
   wherein the active layer structures are electrically connected to each other by a tunnel junction arranged between the active layer structures,
   wherein the at least one mesa further comprises an optical resonator,
   wherein the optical resonator comprises a first Distributed Bragg Reflector and a second Distributed Bragg Reflector,
   wherein the active region is arranged between the first Distributed Bragg Reflector and the second Distributed Bragg Reflector,
   wherein the Vertical Cavity Surface Emitting Laser further comprises a first electrical contact and a second electrical contact,
   wherein the first electrical contract and the second electrical contact are arranged to provide an electrical current to the active region,
   wherein the Vertical Cavity Surface Emitting Laser further comprises an electrical control contact,
   wherein the electrical control contact is arranged to control gain-switched laser emission of the Vertical Cavity Surface Emitting Laser by at least 1 up to m−1 active layer structures by a current between the electrical control contact and the first electrical contact or the second electrical contact,
   wherein the Vertical Cavity Surface Emitting Laser comprises a current aperture arranged between the active region and the first electrode or the second electrode, and
   wherein a distance between the current aperture and an active layer structure furthest away from the current aperture is at least three times a wavelength of laser light emitted by the Vertical Cavity Surface Emitting Laser in the semiconductor material such that a current density in the active layer structure furthest away from the current aperture is decreased in comparison to the active layer structure next to the current aperture.

2. The Vertical Cavity Surface Emitting Laser according to claim 1, wherein the electrical control contact is arranged to control a starting time of the gain-switched laser emission by the current between the electrical control contact and the first electrical contact or the second electrical contact.

3. The Vertical Cavity Surface Emitting Laser according to claim 1, wherein a photoluminescence wavelength of the Vertical Cavity Surface Emitting Laser is at least a resonance wavelength of the optical resonator.

4. The Vertical Cavity Surface Emitting Laser according to claim 1, wherein a photoluminescence wavelength of the active layer structure furthest away from the current aperture is shorter than a photoluminescence wavelength of any other active layer structure comprised by the active region.

5. The Vertical Cavity Surface Emitting Laser according to claim 1,
   wherein the electrical control contact is arranged such that a first electrical current can be provided between the first electrical contact and the electrical control contact and a second electrical current can be provided between the second electrical contact and the electrical control contact, and
   wherein the first electrical current is independent from the second electrical current.

6. The Vertical Cavity Surface Emitting Laser according to claim 5, wherein the electrical control contact is arranged between 1 up to m−1 active layer structures and the remaining active layer structures.

7. The Vertical Cavity Surface Emitting Laser according to claim 1,
   wherein the Vertical Cavity Surface Emitting Laser comprises at least two mesas comprising the at least one mesa,
   wherein at least a first mesa is arranged to provide the gain-switched laser emission, and
   wherein at least a second mesa is arranged to control gain-switched laser emission of the at least first mesa.

8. The Vertical Cavity Surface Emitting Laser according to claim 7,
wherein the at least two mesas comprise at least 1 up to m−1 common active layer structures, and
wherein at least the second mesa is arranged to control the gain switched laser emission of the at least first mesa by means of transversal pumping via the at least 1 up to m−1 common active layer structures.

9. The Vertical Cavity Surface Emitting Laser according to claim 7, wherein at least the second mesa is arranged such that laser emission is inhibited.

10. The Vertical Cavity Surface Emitting Laser according to claim 9, wherein the electrical control contact is arranged to control transversal pumping via the at least 1 up to m−1 common active layer structures by the current between the electrical control contact and the first electrical contact or the second electrical contact.

11. The Vertical Cavity Surface Emitting Laser according to claim 7, wherein the first electrical contact and the second electrical contact are arranged to control a stop time of the gain-switched laser emission by a current between the first electrical contact and the second electrical contact.

12. A time-of-flight sensor module comprising at least one of the Vertical Cavity Surface Emitting Laser according to claim 1, the time-of-flight sensor module further comprising an electrical driver arranged to provide the current between the electrical control contact and the first electrical contact or the second electrical contact.

13. A method of controlling gain-switching of a Vertical Cavity Surface Emitting Laser,
wherein the Vertical Cavity Surface Emitting Laser comprises m active layer structures with m≥2 in a stacked arrangement comprising an optical resonator,
wherein the active layer structures are electrically connected to each other by a tunnel junction arranged between the active layer structures,
wherein the optical resonator comprises a first Distributed Bragg Reflector and a second Distributed Bragg Reflector,
wherein the active region is arranged between the first Distributed Bragg Reflector and the second Distributed Bragg Reflector,
wherein the Vertical Cavity Surface Emitting Laser further comprises a first electrical contact, a second electrical contact, and an electrical control contact,
wherein the Vertical Cavity Surface Emitting Laser comprises a current aperture arranged between the active region and the first electrode or the second electrode, and
wherein a distance between the current aperture and an active layer structure furthest away from the current aperture is at least three times a wavelength of laser light emitted by the Vertical Cavity Surface Emitting Laser in the semiconductor material such that a current density in the active layer structure furthest away from the current aperture is decreased in comparison to the active layer structure next to the current aperture,
the method comprising:
providing a first electrical current to at least 1 up to m−1 active layer structures involved in laser emission by the electrical control contact and the first electrical contact or the second electrical contact,
providing a second electrical current to the active region by the first electrical contact and the second electrical contact to the remaining active layer structures involved in laser emission,
wherein the first electrical current is independent from the second electrical current.

14. A computer readable medium comprising instructions configured to cause the execution of the method according to claim 13 by at least one processing device of a time-of-flight sensor module or by at least one processing device of a device comprising the time-of-flight sensor module.

* * * * *